United States Patent [19]
Kojima

[11] Patent Number: 5,050,235
[45] Date of Patent: Sep. 17, 1991

[54] TRANSMITTER USING GALLIUM ARSENIDE FET WITH MEANS FOR CONTROLLING GATE BIAS VOLTAGE OF THE FET FOR SUPPRESSING UNDESIRED SIGNAL AT A START CONDITION OF THE TRANSMITTER

[75] Inventor: Tatsuru Kojima, Tokyo, Japan
[73] Assignee: NEC Corporation, Japan
[21] Appl. No.: 470,868
[22] Filed: Jan. 26, 1990
[30] Foreign Application Priority Data
Jan. 26, 1989 [JP] Japan ................................ 1-19038
[51] Int. Cl.$^5$ .......................................... H01Q 11/12
[52] U.S. Cl. ..................................... 455/127; 330/277
[58] Field of Search ............... 455/115, 117, 127, 343; 330/269, 273, 277, 279, 285

[56] References Cited
U.S. PATENT DOCUMENTS

| | | | |
|---|---|---|---|
| 4,631,736 | 12/1986 | Yamanoue et al. | 455/127 |
| 4,819,272 | 4/1989 | Shimo et al. | 455/127 |
| 4,890,069 | 12/1989 | Duffalo et al. | 330/277 |
| 4,912,430 | 3/1990 | Frank | 330/277 |
| 4,973,918 | 11/1990 | Schindler | 330/277 |

Primary Examiner—Curtis Kuntz
Attorney, Agent, or Firm—Ostrolenk, Faber, Gerb & Soffen

[57] ABSTRACT

A transmitter using a gallium arsenide FET in a power amplifier and having a biassing circuit for generating a gate biassing voltage for the FET, a first power supply for supplying a first power to the biassing circuit and a second power supply for supplying a second power to the power amplifier, the second power being higher in voltage than the first power and being produced at a time delay from production of the first power at a start condition of the transmitter, wherein the first power is supplied to the biassing circuit through a first diode with a voltage drop to thereby reduce the gate biassing voltage below a normal one so that an undesired signal is suppressed at the power amplifier. The second power is delivered to the biassing circuit through a second diode so that the biassing circuit is driven by the second power to produce the normal biassing voltage. Although a multistage amplifier is used for signal amplification prior to the power amplifier and is supplied with a power from the second power supply, a number of stages of the multistage amplifier is not necessary to be increased for attenuating the undesired signal at the start condition because of the signal suppression of the power amplifier.

5 Claims, 3 Drawing Sheets

TRANSMITTER USING GALLIUM ARSENIDE FET WITH MEANS FOR CONTROLLING GATE BIAS VOLTAGE OF THE FET FOR SUPPRESSING UNDESIRED SIGNAL AT A START CONDITION OF THE TRANSMITTER

BACKGROUND OF THE INVENTION

1. Field of the Invention

The present invention relates to a transmitter circuit including a power amplifier using a gallium arsenide FET (Field Effect Transistor) which is used in, for example, a mobile telecommunication system but the present invention is not restricted to the system.

2. Description of the Prior Art

A conventional transmitter circuit used in, for example, a mobile telecommunication system comprises a power amplifier having an FET as an amplifying element. Recently, a gallium arsenide FET has been used as the amplifying element because the gallium arsenide FET is more efficient than silicon transistors. The power amplifier is for power amplifying a signal delivered thereto to send out a power amplified signal to the transmission line as the transmission signal. A biassing voltage generator is coupled to the gallium arsenide FET and is responsive to an input power supplied thereto to produce a biassing voltage of a negative level determined by a voltage level of the input power. The biassing voltage generator delivers the biassing voltage to the gallium arsenide FET as a gate biassing voltage for the gallium arsenide FET. A controller is used for producing, upon start of the transmitter circuit, a first power-on signal and thereafter a second power-on signal with a time delay from producing the first power-on signal. A first power supply is coupled to the control means and the biassing voltage generating means. The first power supply generates a first electric power in response to the first power-on signal to deliver the first electric power to the biassing voltage generator as the input power. A second power supply is coupled to the control means and the power amplifier. The second power supply produces, in response to the second power-on signal, a second electric power of a voltage level higher than the first electric power to supply the second electric power to the power amplifier.

At a start of the transmitter circuit, the gallium arsenide FET is at first supplied with the gate biassing voltage from the biassing voltage generator but the power amplifier is not yet supplied with the second electric power. This is necessary to protect the gallium arsenide FET from damage. This is because when the gate biassing voltage is not supplied to the FET, application of the voltage across the drain and the source makes a large current flow therethrough and results in damage of the FET.

When an undesired signal is applied to the power amplifier under the start condition, the undesired signal is output from the power amplifier and is transmitted to the transmission line. The conventional transmitter circuit usually comprises a multistage amplifier for previous signal amplification prior to the power amplifier. The multistage amplifier is also energized by an electric power produced in response to the second power-on signal. In order to avoid transmission of the undesired signal, the stage number of the multistage amplifier is increased so as to attenuate the undesired signal at the multistage amplifier. This increases parts and electric power consumption.

SUMMARY OF THE INVENTION

It is an object of the present invention to provide a transmitter circuit using a gallium arsenide FET in a power amplifier wherein a signal passing loss of the power amplifier is large so as to suppress an undesired signal from being sent out to a transmission line until an electric power is supplied to the power amplifier.

The present invention is applicable to such a conventional transmitter circuit for use in sending out a transmission signal to a transmission line comprises a power amplifier having a gallium arsenide FET (Field Effect Transistor) as a main amplifying element for power amplifying a signal delivered thereto to send out a power amplified signal to the transmission line as the transmission signal, biassing voltage generating means coupled to the gallium arsenide FET and responsive to an input power supplied thereto for producing a biassing voltage of a negative level determined by a voltage level of the input power to deliver the biassing voltage to the gallium arsenide FET as a gate biassing voltage for the gallium arsenide FET, control means for producing, upon start of the transmitter circuit, a first power-on signal and thereafter a second power-on signal with a time delay from producing the first power-on signal, first power supply means coupled to the control means and the biassing voltage generating means and responsive to the first power-on signal for generating a first electric power to deliver the first electric power to the biassing voltage generating means as the input power, and second power supply means coupled to the control means and the power amplifier and responsive to the second power-on signal for producing a second electric power of a voltage level higher than the first electric power to supply the second electric power to the power amplifier. A transmitter circuit according to the present invention comprises first diode means connecting the first power supply means and the biassing voltage generating means for permitting the first electric power to be supplied from the first power supply means to the biassing voltage generating means therethrough but with a voltage drop, and second diode means connecting the second power supply means and the biassing voltage generating means for supplying the second electric power from the second power supply means to the biassing voltage generating means with a voltage drop as the input power in place of the first electric power, whereby the biassing voltage is increased in the negative level in response to production of the second power-on signal.

As another aspect of the present invention, the transmitter circuit further comprises a multistage amplifier delivering the signal to the power amplifier. The second power supply means generates an additional electric power for energizing the multistage amplifier in response to the second power-on signal.

DESCRIPTION OF PREFERRED EMBODIMENT:

Prior to description of an embodiment of the present invention, a conventional wireless telephone set used in the mobile telecommunication system and a conventional transmitter circuit used in the telephone set will be described with reference to FIGS. 1 and 2 for assisting better understanding of the present invention.

Figure 1:
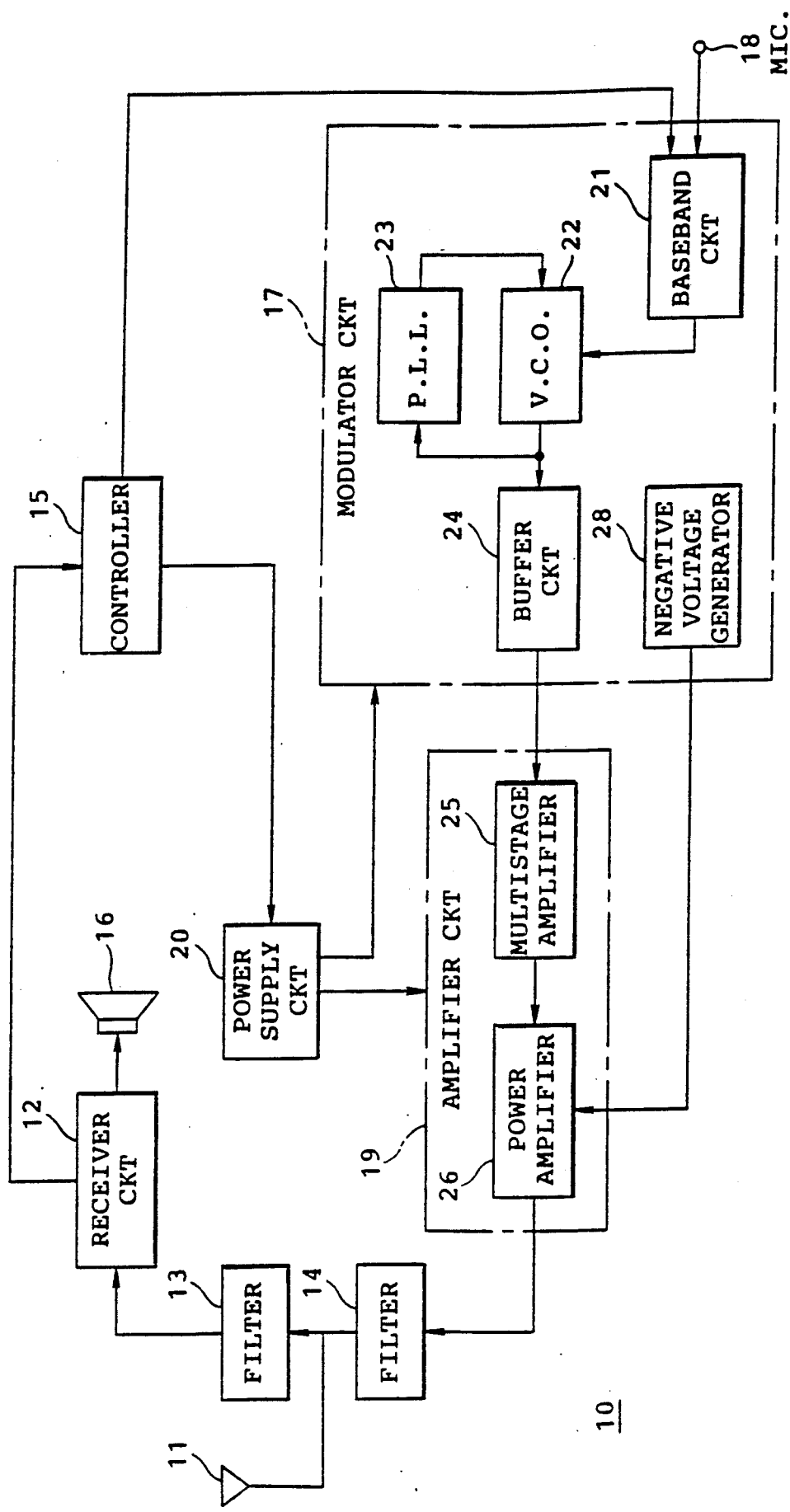
FIG. 1 is a block diagram view of a conventional wireless telephone set used in a mobile telecommunication system.

Referring to FIG. 1, the shown telephone set 10 comprises an transmitting/receiving antenna 11, a receiver circuit 12 and a transmitter circuit which are connected to the antenna 11 through filters 13 and 14, respectively. The telephone set 10 further comprises a controller 15 for controlling the transmitter circuit.

The receiver circuit 12 receives a signal received at the antenna 11 through the filter 13 and processes the received signal to deliver an audio signal in the received signal to a speaker 16 so as to drive the speaker 16. The receiver circuit 12 further extracts a data signal from the received signal to deliver the data signal to the controller 15.

The transmitter circuit comprises a modulator circuit 17 for modulating a carrier by a speech signal from a microphone (MIC.) 18 and a data signal from the controller 15 to produce a modulated signal, an amplifier circuit 19 for amplifying the modulated signal to deliver an output signal to the antenna 11 through the filter 14 so as to send out the output signal as a transmission signal, and a power supply circuit 20 for supplying electric powers to the modulator circuit 17 and the amplifier circuit 19 under control of the controller 15, respectively.

The modulator circuit 17 comprises a baseband circuit 21 for filtering the speech signal and the data signal to produce a baseband signal, a frequency synthesizer circuit comprising a voltage controlled oscillator (VCO) 22 and a phase locked loop (PLL) 23 for producing the modulated signal by modulating the carrier generated at the voltage controlled oscillator 22 by the baseband signal, and a buffer circuit 24.

The amplifier circuit 19 comprises a multistage amplifier 25 responsive to the modulated signal through the buffer circuit 24 for amplifying the modulated signal to produce an amplified signal and a power amplifier 26 responsive to the amplified signal for power amplifying the amplified signal to produce the transmission signal.

Figure 2:
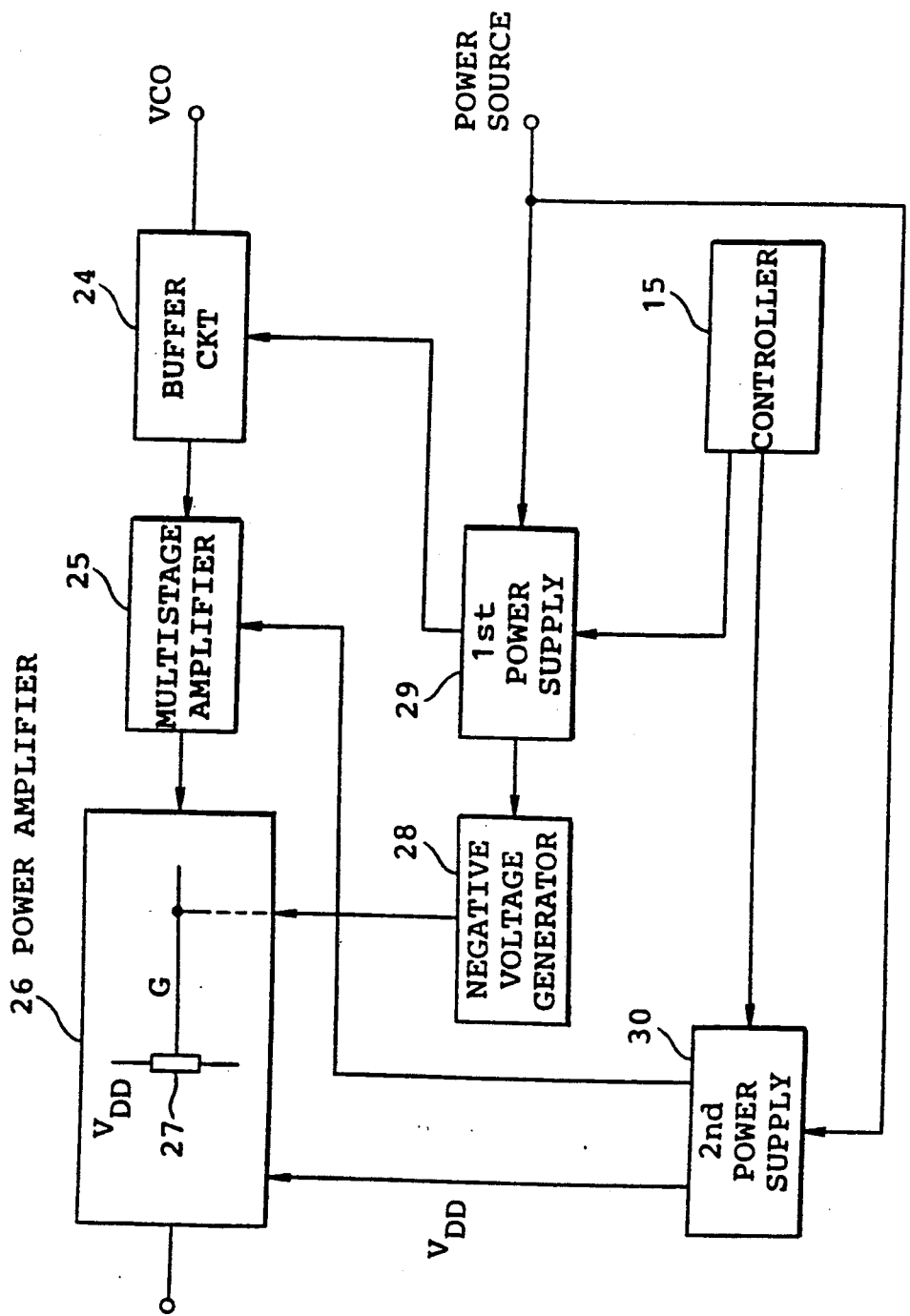
FIG. 2 is a block diagram view of a main part of a transmitter circuit used in the system of FIG. 1.

The power amplifying circuit 26 comprises a gallium arsenide FET 27 as shown in FIG. 2.

The transmitter circuit further comprises a negative voltage generator 28 which is responsive to an input power supplied thereto for generating a voltage of a negative level determined by a voltage level of the input power. The voltage is supplied to the gallium arsenide FET 27 as its gate bias. Therefore, the negative voltage generator 28 functions as a biassing voltage generating means.

Since the transmitter circuit consumes a large power during operation, the power supply circuit 20 is stopped during a waiting condition of the transmitter circuit. At a start of the transmitter circuit for a calling operation or an answering operation of the telephone set 10, the power supply circuit 20 is turned on by the controller 15 to supply electric powers to the modulator circuit 17 and the amplifier circuit 19 which are then energized.

The modulator circuit 17 comes into a stable operation with a time lag after starting in response to the first electric power. In order to send out the transmission signal from the antenna 11 after the modulator circuit 17 is stabilized, it is required that the amplifier circuit 19 is energized with a time delay of, for example, 100 milliseconds which is corresponding to the time lag.

To this end, the controller 15 time-serially produces a first power-on signal and a second power-on signal. That is, the second power-on signal is produced with the time delay from the first power-on signal. The power supply circuit 20 produces, in response to the first power-on signal from the controller 15, a first electric power of, for example, 5 volts which is supplied to the modulator circuit 17. Thereafter, the power supply circuit 20 is responsive to the second power-on signal from the controller 15 to produce a second electric power which is supplied to the amplifier circuit 19.

Referring to FIG. 2, the power supply circuit 20 is shown as a first and a second power supplies 29 and 30 which produce the first and the second electric powers in response to the first and the second power-on signals from the controller 15, respectively.

In detail, an electric power for energizing the power amplifier 26 is different from and larger than another electric power for energizing the multistage amplifier 25. Therefore, the second electric power supply 30 is shown in FIG. 2 to produce and deliver two electric powers to the power amplifier 26 and the multistage amplifier 25. The electric power to be supplied to the power amplifier 26 will be referred to as the second electric power and has a voltage of, for example, 6 volts, higher than that of the first electric power. Another electric power to be supplied to the multistage amplifier 25 will be referred to as an additional electric power and has a voltage of, for example, 5 volts.

Returning to FIG. 1, the buffer circuit 24 is for protecting the voltage controlled oscillator 22 from variation of its load due to an impedance variation caused when the multistage amplifier 25 is energized after start of the voltage controlled oscillator 22.

Although the negative voltage generator 28 functions to supply the gate biassing voltage for the gallium arsenide FET (27 in FIG. 2) in the power amplifier 26, the negative voltage generator 28 is energized by not the second electric power from the second power supply (30 in FIG. 2) but the first electric power from the first power supply (29 in FIG. 2). Therefore, the negative voltage generator 28 is shown in a block of the modulator circuit 17 which is supplied with the first electric power. This is because the gate biassing voltage is necessary to be supplied to the gallium arsenide FET (27 in FIG. 2) before an voltage is applied across a drain and a source of the gallium arsenide FET by supply of the second electric power. When the gate biassing voltage is not supplied to the FET, application of the voltage across the drain and the source makes a large current flow therethrough and results in damage of the FET.

An integrated circuit which is available in commerce, for example, NJM 7660 made and sold by NEW JAPAN RADIO CO., LTD. a Japanese corporation, is used as the negative voltage generator 28. The integrated circuit comprises a first and a second capacitors and a MOS transistor switch. The first capacitor is charged by the first electric power and then discharged to the second capacitor through the MOS transistor switch so that the second capacitor is charged. Thus, the negative voltage is obtained from the second capacitor.

At a start of the transmitter circuit, the first power supply 29 produces the first electric power in response to the first power-on signal from the controller 15 at first and the modulator circuit 17 is, therefore, energized. Accordingly, the modulated signal of about 0 dBm is supplied to the multistage amplifier 25 from the buffer circuit 24 in the modulator circuit 17. Since the multistage amplifier 25 is not yet supplied with any electric power, the modulated signal is attenuated by about 15 dB at each stage of the multistage amplifier 25 and applied to the power amplifier 26 as an attenuated signal. Then, the attenuated signal is further attenuated by about 30 dB at the power amplifier 26 from which a signal is delivered to the antenna 11 as an output signal. The output signal is radiated from the antenna 11. This means that an undesired signal is radiated from the antenna 11 before the modulator circuit 17 is stabilized.

In order to avoid the undesired signal radiation, a stage number of the multistage amplifier 25 has been increased in the prior art. This results to increase of parts and electric power consumption.

Figure 3:
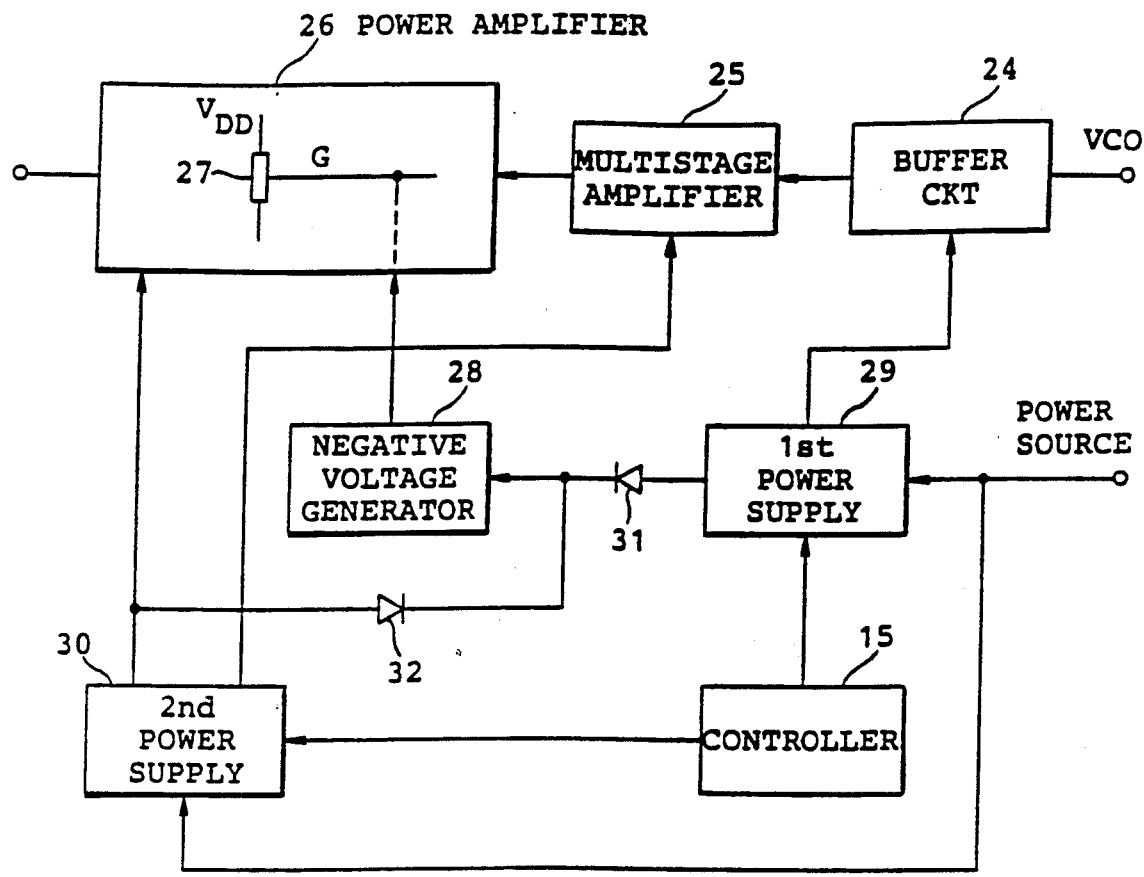
FIG. 3 is a block diagram view of a transmitter circuit according to an embodiment of the present invention.

Referring to FIG. 3, a transmitter circuit according to an embodiment of the present invention shown therein is similar to that of FIG. 2 except for a first and a second diodes 31 and 32. Therefore, the similar parts are represented by the same reference numbers in FIG. 2 and the description thereto is omitted for the purpose of simplification of the description.

The first diode 31 is used to connect the first power supply 29 and the negative voltage generator 28. Therefore, the first electric power from the first power supply 29 is supplied to the negative voltage generator 28 as the input power thereof through the first diode 31. However, the first diode 31 makes a potential difference across an anode and a cathode thereof. Therefore, the first electric power is supplied to the negative voltage generator 28 with a reduced voltage. As a result, the biassing voltage from the negative voltage generator 28 is decreased in the negative level.

Figure 4:
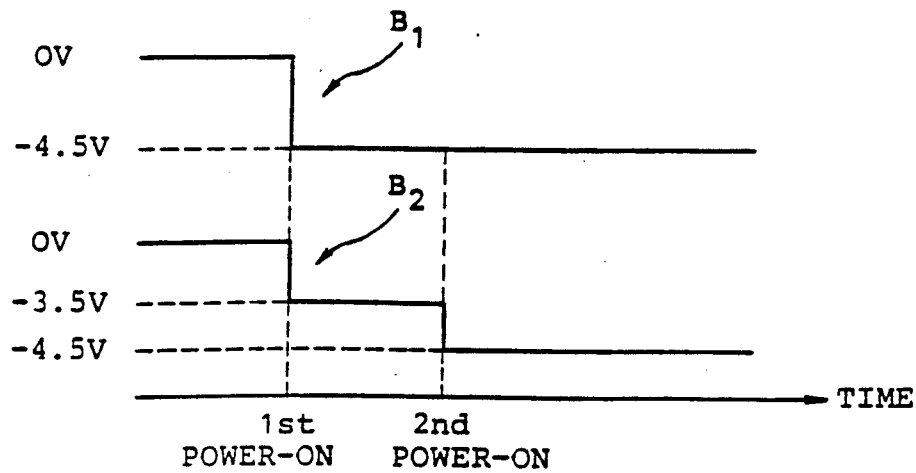
FIG. 4 is a view illustrating a biassing voltage variation for a gallium arsenide FET in the embodiment of FIG. 3 in comparison with that in the conventional transmitter circuit of FIG. 2.

As an example, when the electric power has a voltage of 5 volts, it is supplied to the negative voltage generator 28 with a reduced voltage of about 4.3 volts. Therefore, the biassing voltage from the negative voltage generator 28 is about $-3.5$ volts. This is lower in the negative level than the biassing voltage of $-4.5$ volts in the conventional circuit of FIG. 2 without the first diode 31. FIG. 4 shows the biassing voltage $B_1$ in the conventional circuit of FIG. 2 and the biassing voltage $B_2$ in the circuit of FIG. 3.

While, the second diode 32 is used to connect the second power supply 30 and the negative voltage generator 28. Therefore, the second electric power from the second power supply 30 is supplied to the negative voltage generator 28 as the input power thereof through the second diode 32. The second diode 32 also makes a potential difference across an anode and a cathode thereof. Therefore, the second electric power is supplied to the negative voltage generator 28 with a reduced voltage.

However, the second electric power has a voltage higher than the fist electric power. Therefore, when the second electric power is produced from the second power supply 30 in response to the second power-on signal after the first power-on signal from the controller 15, the voltage of the input power of the negative voltage generator 28 is elevated because the second electric power is supplied to the negative voltage generator 28 as the input power. Therefore, the biassing voltage from the negative voltage generator 28 is increased in the negative level.

For example, when the second electric power has a voltage of 6 volts, the voltage of the input power is about 5 volts. Therefore, the biassing voltage becomes $-4.5$ volts, as shown at $B_2$ in FIG. 4. Thus, the gallium arsenide FET 27 is supplied with a normal gate biassing voltage from the negative voltage generator 28 after the second power supply 30 is energized in response to the second power-on signal from the controller 15.

When the gallium arsenide FET is not supplied with an electric power, a signal applied to the FET is output therefrom with a large passing loss if the gate biassing voltage of the FET is low in the negative level. On the other hand, when the gate biassing voltage is high in the negative level, the signal is output from the FET with a reduced loss.

For example, when the gate biassing voltage is elevated by one voltage, that is, lowered by one volt in the negative level, a signal attenuation is increased by about 20 dB.

In the transmitter circuit of FIG. 3, the biassing voltage from the negative voltage generator 28 is lower than the normal gate biassing voltage of the gallium arsenide FET 27 during an unstable time duration when the first electric power is produced but the second electric power is not yet produced at a start condition of the transmitter circuit. Therefore, the signal passing loss is increased at the power amplifier 26 in comparison with the conventional circuit in FIG. 2. This means that the stage number of the multistage amplifier 25 can be decreased. In the above-described example wherein the gate biassing voltage is the normal gate biassing voltage of about $-4.5$ volts but $-3.5$ volts during the unstable time duration, one stage can be omitted from the multistage amplifier 25. As a result, the number of parts and the power consumption are reduced.

It is possible to use in place of the first diode 31 a plurality of diodes which are connected in series with one another. In that case, the first electric power is supplied to the negative voltage generator 28 with a further lowered voltage. Accordingly, the signal passing loss at the FET is further increased.

It is also possible to use in place of the second diode 32 a plurality of diodes which are connected in series with one another if it insures the normal gate biassing voltage for the FET 27 to do so.

What is claimed is:

1. In a transmitter circuit for use in sending out a transmission signal to a transmission line comprising a power amplifier having a gallium arsenide FET (Field Effect Transistor) as a main amplifying element for power amplifying a signal delivered thereto to send out a power amplified signal to said transmission line as said transmission signal, biassing voltage generating means coupled to said gallium arsenide FET and responsive to an input power supplied thereto for producing a biassing voltage of a negative level determined by a voltage level of said input power to deliver said biassing voltage to said gallium arsenide FET as a gate biassing voltage for the gallium arsenide FET, control means for producing, upon start of said transmitter circuit, a first power-on signal and thereafter a second power-on signal with a time delay from producing said first power-on signal, first power supply means coupled to said control means and said biassing voltage generating means and responsive to said first power-on signal for generating a first electric power to deliver said first electric power to said biassing voltage generating means as said input power, and second power supply means coupled to said control means and said power amplifier and responsive to said second power-on signal for producing a second electric power of a voltage level higher than said first electric power to supply said second electric power to said power amplifier, the improvement which comprises first diode means connecting said first power supply means and said negative voltage generating means for permitting said first electric power to be supplied from said first power supply means to said biassing voltage generating means therethrough but with a voltage drop, and second diode means connecting said second power supply means and said biassing voltage generating means for supplying said second electric power from said second power supply means to said biassing voltage generating means with a voltage drop as said input power in place of said first electric power, whereby said biassing voltage is increased in the negative level in response to production of said second power-on signal.

2. A transmitter circuit as claimed in claim 1 comprising a multistage amplifier delivering said signal to said power amplifier, wherein said second power supply means generates an additional electric power for energizing said multistage amplifier in response to said second power-on signal.

3. A transmitter circuit as claimed in claim 1, wherein said time delay is about 100 milliseconds.

4. A transmitter circuit as claimed in claim 3, wherein said second electric power is one volt higher than said first electric power.

5. A transmitter circuit as claimed in claim 4, wherein said first and said second electric powers have voltages of 5 volts and 6 volts, respectively, and said biassing voltage being changed from $-3.5$ volts to $-4.5$ volts when said second power supply means produces said second electric power in response to said second power-on signal.

* * * * *